(12) United States Patent  
King

(10) Patent No.: US 8,785,261 B2  
(45) Date of Patent: Jul. 22, 2014

(54) MICROELECTRONIC TRANSISTOR HAVING AN EPITAXIAL GRAPHENE CHANNEL LAYER

(75) Inventor: Sean King, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 12/888,979

(22) Filed: Sep. 23, 2010

(65) Prior Publication Data

US 2012/0074387 A1 Mar. 29, 2012

(51) Int. Cl.
*H01L 21/00* (2006.01)
*H01L 21/84* (2006.01)

(52) U.S. Cl.
USPC .................. 438/151; 257/E21.409

(58) Field of Classification Search
USPC ......... 257/29, 24, E21.409, E21.101, E21.09, 257/E21.093; 438/478, 151, 507, 509
See application file for complete search history.

(56) References Cited

U.S. PATENT DOCUMENTS

| | | | |
|---|---|---|---|
| 5,611,955 A | 3/1997 | Barrett et al. | |
| 2005/0284337 A1* | 12/2005 | Shigematsu et al. | 106/476 |
| 2006/0180859 A1* | 8/2006 | Radosavljevic et al. | 257/347 |
| 2006/0267024 A1* | 11/2006 | Murphy et al. | 257/77 |
| 2009/0181502 A1 | 7/2009 | Parikh | |
| 2009/0236609 A1* | 9/2009 | de Heer et al. | 257/77 |
| 2009/0294759 A1* | 12/2009 | Woo et al. | 257/29 |
| 2010/0051960 A1* | 3/2010 | Chen et al. | 257/76 |
| 2010/0065988 A1* | 3/2010 | Hannon et al. | 264/500 |
| 2011/0034011 A1* | 2/2011 | Ma | 438/509 |
| 2011/0042687 A1* | 2/2011 | Chu et al. | 257/77 |
| 2011/0092054 A1* | 4/2011 | Seo et al. | 438/473 |
| 2011/0114918 A1* | 5/2011 | Lin et al. | 257/24 |
| 2011/0114919 A1* | 5/2011 | Jenkins et al. | 257/29 |
| 2011/0169013 A1* | 7/2011 | Suvorov | 257/77 |
| 2012/0007054 A1* | 1/2012 | Chang et al. | 257/29 |
| 2012/0028052 A1* | 2/2012 | Chu et al. | 428/428 |

FOREIGN PATENT DOCUMENTS

| | | | |
|---|---|---|---|
| JP | 2009-182173 A | 8/2009 | |
| JP | 2009-277803 A | 11/2009 | |
| TW | 200946346 A1 | 11/2009 | |
| WO | 2012/040080 A2 | 3/2012 | |
| WO | 2012/040080 A3 | 6/2012 | |

OTHER PUBLICATIONS

Hyun-Chul Kang, Epitaxial graphene field-effect transistors on silicon substrates, Solid-State Electronics, (2010) 1010-1014.*

Foti, G. "Silicon Carbide: From Amophous to Crystalline Material", Applied Surface Science 184 (2001), www.elsevier.com/locate/apsusc,(2001), pp. 20-26.

(Continued)

*Primary Examiner* — Daniel Luke
*Assistant Examiner* — Latanya N Crawford
(74) *Attorney, Agent, or Firm* — Winkle, PLLC

(57) ABSTRACT

The present disclosure relates to the field of microelectronic transistor fabrication and, more particularly, to forming a graphene layer as a channel layer for a microelectronic transistor.

25 Claims, 10 Drawing Sheets

(56) References Cited

OTHER PUBLICATIONS

Fu, Xiao-An et al., "Chemical Mechanical Polishing of Cubic Silicon Carbide Films Grown on S✲ (100 Wafers", Journal of the Electrochemical Society, 149 (12) G643-G647 (2002) 0013-4651/2002/149(12)/G643/5 @ The Electrochemical Society, Inc., Manuscript received Mar. 12, 2002. Available electronically Oct. 18, 2002. Department of Electrical Engineering and Computer Science, Case Western Reserve University, Cleveland, Ohio 44106, USA,(Jun. 3, 2002), pp. G643-G647.

Gazicki, M. et al., "Deposition and Properties of Germaniumrcarbon Films Deposited From Tetramethylgermanium in a Parallel Plate RF Discharge", Thin Solid Films 322 (1998), Received Jun. 3, 1997; accepted Oct. 23, 1997; 0040-6090/98,(Oct. 1997), pp. 123-131.

Chandrasekhar, D. et al., "Strategies for the Synthesis of Highly Concentrated Si12yCy Diamond-structured Systems", Applied Physics Letters vol. 72, No. 17, Downloaded Dec. 7, 2010 to 134.134.137.71. Downloaded Dec. 7, 2010 to 134.134.137.71. Redistribution subject to AIP licence or copyright; see http://apl.aip.org/about/rights_and_permissions.,(Apr. 27, 1998), pp. 2117-2119.

Gazicki, M. et al., "Thermal Stability of Semiconducting Thin Germanium/Carbon Alloy Films Produced from TetraethylGermanium in an RF Glow Discharge", Thin Solid Silms 352 (1999), (Jun. 3, 1999), pp. 6-8.

Emtsev, Konstantin V., et al., "Towards Wafer-Size Graphene Layers by Atmospheric Pressure Graphitization of Silicon Carbide", Published Online: Feb. 8, 2009 DOI: 10.1038/NMAT2382, Nature Materials vol. 8 Mar. 2009 www.nature.com/naturematerials,(Mar. 2009), pp. 203-207.

De Arco, Lewis G., et al., "Synthesis, Transfer and Devices of Single- and Few-Layer Graphene by Chemical Vapor Deposition", Manuscript ID: TNANO-00321-2008, Intel Corporation via the Intel Library. Downloaded on Feb. 7, 2009 at 16:04 from IEEE Xplore.,(Feb. 7, 2009), pp. 1-4.

Calcagno, L. et al., "Crystallisation Mechanism of Amorphous Silicon Carbide", Applied Surface Science 184 (2001), Published by Elsevier Science B.V. PII: S0 169-4332 (01) 00487-1,(2001), pp. 123-127.

Berger, Claire et al., "Ultrathin Epitaxial Graphite: 2D Electron Gas Properties band a Route toward Graphene-based Nanoelectronics", J. Phys. Chem. B 2004, 108, 10.1021/jp040650f 2004 American Chemical Society; Published on Web Dec. 3, 2004,(2004),J. Phys. Chem. B 2004, pp. 108.

Golecki, I. et al., "Single-Crystalline, Epitaxial Cubic SIC Films Grown on (100) Si at 750 C by Chemical Vapor Deposition", Appl. Phys. Lett. 60 (14), Apr. 6, 1992 0003-6951/92/I 41703-03 1992 American Institute of Physics, Allied-Signal, Inc., Corporate Research and Technology, Morristown, New Jersey 07962; (Received Dec. 3, 1991; accepted for Publication Feb. 4, 1992),(Apr. 6, 1992).

Kedzierski, Jakub et al., "Epitaxial Graphene Transistors on SiC Substrates", IEEE Transactions on Electron Devices, vol. 55, No. 8, Aug. 2008, Downloaded on Feb. 7, 2009 at 16:06 from IEEE Xplore, (Aug. 2008), pp. 2078-2085.

Han, Melinda Y., et al., "Energy Band-Gap Engineering of Graphene Nanoribbons", PRL 98, 206805 (2007) Physical Review Letters, May 18, 2007, pp. 206805-1-206805-4.

King, Sean W., et al., "Chemical Vapor Cleaning of 6H-SiC Surfaces", Journal of the Electrochemical Society, 146 (9) 3448-3454 (1999) S0013-4651 (98)11-055-8 CCC: The Electrochemical Society, Inc., Downloaded Feb. 14, 2009 to 134.134.139.73. Manuscript submitted Nov. 16, 1998; revised manuscript received Jul. 13, 1999, pp. 3448-3454.

Kimoto, T. et al., "Formation of Semi-Insulating 6H-SiC Layers by Vanadium Ion Implantations", Appl. Phys. Lett. 69 (8), Aug. 19, 1996 0003-6951/96/69(8)/113/3/1996 American Institute of Physics Department of Electronic Science and Engineering, Kyoto University, Yoshidahonmachi, Sakyo, Kyoto 606-01, Japan, Received May 13, 1996; accepted for publication Jun. 5, 1996, (Aug. 19, 1996), pp. 1113-1115.

King, S. W. et al., "Hydrogen desorption kinetics and band bending for 6H—SiC(0 0 0 1) surfaces", Surface Science 603, Issue 20 Oct. 15, 2009, ISSN 0039-6028, Received Feb. 23, 2009 Accepted for publication Aug. 24, 2009 Available online Aug. 29, 2009; http://www.elsevier.com/copyright,(Aug. 29, 2009), pp. 3104-3118.

King, Sean W. et al., "Wet Chemical Processing of (0001)Si 6H-SiC", Journal of The Electrochemical Society, 146 (5) 1910-1917 (1999) S0013-4651 (98)08-067-7 CCC: The Electrochemical Society, Inc., Department of Materials Science and Engineering, and Department of Physics, North Carolina State University, Raleigh, North Carolina 27695, USA; Manuscript received Aug. 17, 1998. Downloaded Feb. 14, 2009 to 134.134.139.73.,(1999), pp. 1910-1917.

Khan, I. H., et al., "The Growth of Single-Crystal Films of Cubic Silicon Carbide on Silicon", vol. 11, No. 1 Applied Physics Letters Jul. 1, 1967, General Telephone & Electronics Laboratories I ne. Bayside, New York (Received Apr. 28, 1967); Downloaded Dec. 7, 2010 to 134.134.137.71.,(Jul. 1, 1967), pp. 12-13.

Kny, Erich et al., "Organotini Polymers Formed by Glow-Discharge Polymerization", J. Phys. Chem. 1960, 84, 1635-1638, 0022-3654/80/2084-1638$10.0 010; copyright 1980 American Chemical Society; Lord Corporation, Erie, Pennsylvania 165 12 (Received Oct. 15, 1979),(1980), pp. 1635-1638.

Ikoma, K. et al., "Heteroepitaxial Growth of 13-Sic on Si (111) by CVD Using a CHsCI-SiH4-H2 Gas System", J. Electrochem. Soc., vol. 138, No. 10, Oct. 1991. The Electrochemical Society, Inc., Downloaded Jun. 3, 2010 to 134.134.139.70,(Oct. 1991), pp. 3028-3031.

Gu, Gong et al., "Field Effect in Epitaxial Graphene on a Silicon Carbide Substrate", Applied Physics Letters, 253507 2007, 2007 American Institute of Physics. DOI: 10.1063/1.2749839; Downloaded Dec. 7, 2010 to 134.134.139.72., (Jun. 19, 2007), pp. 90-93.

Ouyang, Yijan et al., "Projected Performance Advantage of Multilayer Graphene Nanoribbons as a Transistor Channel Material", Nano Res (2010) 3: 8-15 DOI 10.1007/s12274-010-1002-8, Received: Oct. 2, 2009 / Revised: Nov. 13, 2009 / Accepted: Nov. 15, 2009,(2010), pp. 8-15.

Nishino, Shigehiro et al., "Production of Large-Area Single-Crystal Wafers of Cubic SiC for Semiconductor Devices", Appl. Phys. Lett.. vol. 42. No. 5. Mar. 1, 1983, 0003-6951/83/050460-03 1983 American Institute of Physics; Downloaded Jun. 3, 2010 to 134.134.139.72,(Mar. 1, 1983), pp. 460-462.

Madapura, M. et al., "Heteroepitaxial Growth of SiC on Si(100) and (111) by Chemical Vapor Deposition Using Trimethylsilane", Journal of The Electrochemical Society, 146 (3) 1197-1202 (1999), S0013-4651(98)01-060-X CCC: The Electrochemical Society, Inc.; Downloaded Dec. 7, 2010 to 134.134.139.74,(1999), pp. 1197-1202.

Li, Xuesong et al., "Transfer of Large-Area Graphene Films for High-Performance Transparent Conductive Electrodes", Nano Letters 2009 vol. 9, No. 12., 10.1021/nl902623y CCC: 2009 American Chemical Society Published on Web Oct. 21, 2009,(2009), pp. 4359-4363.

Liu, Z. T., et al., "Structure and Properties of Germanium Carbide Films Prepared by RF Reactive Sputtering in Ar / CH4", Jpn. J. Appl. Phys. vol. 36 (1997) Part 1, No. 6A, Jun. 1997, (Received Sep. 2, 1996; accepted for publication Dec. 16, 1996);,(Jun. 1997), pp. 3625-3628.

Pandey, Ravindra et al., "A Theoretical Study of Stability, Electronic, and Optical Properties of GeC and SnC", Journal of Applied Physics vol. 88, No. 11, Received Jan. 18, 2000; accepted for publication May 26, 2000; 0021-8979/2000/88(11)/6462/5; Downloaded Dec. 7, 2010 to 134.134.137.71.,(Dec. 2000), pp. 6462-6466.

Li, W. et al., "Growth and Characterization of Epitaxial Gel AxCx Thin Films on (100 Si", J. Vac. Sci. Technol. A 19(5), JVST A—Vacuum, Surfaces, and Films; Received Sep. 11, 2000; accepted Jul. 2, 2001; 0734-2101/2001/1+(5/2617/May 2001 American Vacuum Society,(Sep.-Oct. 2001), pp. 2617-2621.

Krishnamurthy, M. et al., "Microstructural Development and Optical Properties of Epitaxial Ge1-xCx Alloys on Si (100)", Appl. Phys. Lett. vol. 69 No. 17, Received Jul. 10, 1996; accepted for publication Aug. 26, 1996; Downloaded Dec. 7, 2010-to-134.134.137.71.,(Oct. 21, 1996), pp. 2572-2574.

(56) References Cited

OTHER PUBLICATIONS

Lemme, Max C., et al., "A Graphene Field-Effect Device", IEEE Electron Device Letters, vol. 28, No. 4, Downloaded on Feb. 7, 2009 at 16:10 from IEEE Xplore; 0741-3106/2007 IEEE,(Apr. 2007), pp. 282-284.

Kolodzey, J. et al., "Growth of Germanium-Carbon Alloys on Silicon Substrates by Molecular Beam Epitaxy", Appl. Phys. Lett. 67 (13), Received Apr. 20, 1995; accepted for publication Jul. 22, 1995; , 0003-6951/95/67(13)/1865/3; 1995 American Institute of Physics; Downloaded Dec. 7, 2010 to 134.134.137.71.,(Sep. 25, 1995), pp. 1865-1867.

Wang, Xinran et al., "Room-Temperature All-Semiconducting Sub-10-nm Graphene Nanoribbon Field-Effect Transistors", Physical Review Letters PRL 100, 206803 (2008); week ending May 23, 2008, DOI: 10.1103/PhysRevLett.100.206803 PACS Nos. 85.35-p. 73.63.-b; 0031-9007/08/100(20)/206803(4); 2008; The American Physical Society,(May 23, 2008), pp. 206803-1206803-4.

Zorman, Christian A., et al., "Epitaxial Growth of 3C-Sic Films on 4 in. Diam (100) Silicon Wafers by Atmospheric Pressure Chemical Vapor Deposition", J. Appl. Phys. 78 (8), Oct. 15, 1995, Received Mar. 20, 1995; accepted for publication Jun. 15, 1995; Downloaded Jun. 3, 2010 to 134.134.137.73; 0021-8979/95/78(8)/5136/3; 1995 American Institute of Physics,(Oct. 15, 1995), pp. 5136-5138.

Tsuchida, Hidekazu et al., "Si-H Bonds on the 6H-SiC(OOOl) Surface after H2 Annealing", Jpn. J. Appl. Phys. vol. 36 (1997) ; Part 2, No. 6A, Received Feb. 17, 1997; accepted for publication Apr. 9, 1997;,(Jun. 1, 1997), pp. L 699-L 702.

Wu, Xiaowen et al., "The Deposition and Optical Properties of Ge1-xCx Thin Film and Infrared Multilayer Antireflection Coatings", Thin Solid Films 516 (2008) Science Direct, Received Mar. 22, 2006; received in revised form Aug. 29, 2007; accepted Sep. 5, 2007; Available online Sep. 14, 2007; 0040-6090,(2008), pp. 3189-3195.

Zhou, S. Y., et al., "Substrate-Induced Bandgap Opening in Epitaxial Graphene", Nature Materials vol. 6, Published online: Sep. 9, 2007; doi:10.1038/nmat2003; www.nature.com/naturematerials,(Oct. 2007), pp. 770-775.

Sui, Yang et al., "Screening and Interlayer Coupling in Multilayer Graphene Field-Effect Transistors", Nano Letters vol. 9, No. 8, Received May 1, 2009; Revised Manuscript Received Jul. 13, 2009; 10.1021/nl901396g CCC: American Chemical Society; Published on Web Jul. 29, 2009,(2009), pp. 2973-2977.

Yuan, Haojie et al., "Synthesis by Laser Ablation and Characterization of Pure Germanium-Carbon Alloy Thin Films", Chem. Mater. 1993,5, Received Oct. 9, 1992. Revised Manuscript Received Jan. 12, 1993; Q897-4756/93/2805-Q47; 1993 American Chemical Society,(1993), pp. 479-485.

Tyczkowski, J. et al., "Electrical and Optical Properties of Carbon-Tin Films Plasma-Deposited from Tetramethyltin in a Three-Electrode Reactor", Applied Surface Science 113/114, 0169-4332/97; PII SO 169-4332(96)00943-9,(1997), pp. 534-538.

Sano, Eiichi et al., "Performance Prediction of Graphene-Channel Field-Effect Transistors", Japanese Journal of Applied Physics 48 (2009) 011604, Received Jul. 31, 2008; accepted Oct. 15, 2008; published online Jan. 20, 2009; The Japan Society of Applied Physics,(2009), pp. 011604-1-011604-4.

Racanelli, M. et al., "Alternate Surface Cleaning Approaches for Ultra High Vacuum Chemical Vapor Deposition Epitaxy of Si and GexSi1-x", J. Electrochem. Soc., vol. 138, No. 12, Downloaded Dec. 7, 2010 to 134.134.137.71; The Electrochemical Society, Inc.,(Dec. 1991), pp. 3783-3789.

Satoh, Masataka et al., "Solid Phase Epitaxy of Implantation-Induced Amorphous Layer in (1100)-and (1120)-Oriented 6H-SiC", Journal of Applied Physics vol. 89, No. 3, Received Aug. 14, 2000; accepted for publication Nov. 13, 2000; downloaded Dec. 7, 2010 to 134.137.137.71; 0021-8979/2001/89(3)/1986/3; 2001 American Institute of Physics,(Feb. 1, 2001), pp. 1986.

Song, Ho K., et al., "Homoepitaxial Growth and Electrical Characterization of Iron-Doped Semi-Insulating 4H-SiC Epilayer", Applied Physics Letters 89, Received Apr. 20, 2006; accepted Aug. 3, 2006; published online Oct. 11, 2006; DOI: 10.1063/1.2354485; Downloaded Jun. 3, 2010 to 134.134.139.72; 0003-6951/2006/89(15)/152112/3/; 2006 American Institute of Physics,(2006), pp. 152112-1-152112-3.

Zhou, Ling et al., "Chemomechanical Polishing of Silicon Carbide", J. Electrochem. Soc., vol. 144, No. 6, Downloaded Jun. 3, 2010 to 134.134.137.71 ;The Electrochemical Society, Inc.,(Jun. 1997), pp. L161-L163.

International Search Report and Written Opinion Received for PCT Patent Application No. PCT/US2011/052097, Mailed on Apr. 25, 2012, 9 pages.

International Preliminary Report on Patentability Received for PCT Patent Application No. PCT/US2011/052097, mailed on Apr. 4, 2013, 6 pages.

Office Action received for Taiwanese Patent Application No. 100133944, mailed on Dec. 13, 2013, 16 pages of Office Action including 9 pages of English translation.

\* cited by examiner

MICROELECTRONIC TRANSISTOR HAVING AN EPITAXIAL GRAPHENE CHANNEL LAYER

BACKGROUND

Embodiments of the present description generally relate to the field of microelectronic transistor fabrication and, more particularly, to forming a graphene channel layer for a microelectronic transistor.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
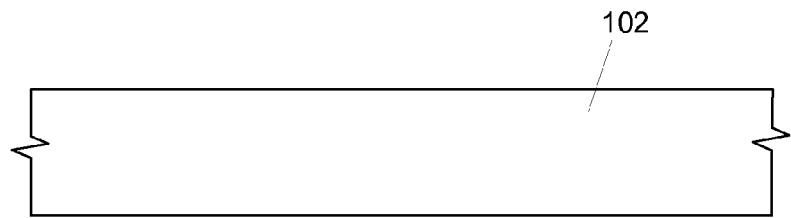
FIG. 1 illustrates a side cross-sectional view of a silicon substrate.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description generally relate to the field of microelectronic transistor fabrication and, more particularly, to forming a graphene layer as a channel layer for a microelectronic transistor.

As the pace of improvements in CMOS (complementary metal-oxide semiconductor) transistor performance through classic Dennard scaling slows down, alternative methods for increasing transistor speed and performance are being sought. Current methods for increasing channel mobility in microelectronic transistors rely on producing various levels of tensile or compressive strain in the channel material. Strain in NMOS (n-channel metal-oxide semiconductor) devices is most commonly achieved utilizing epitaxial growth of lattice mismatched silicon/silicon germanium, and in PMOS (p-channel metal-oxide semiconductor) devices through embedded silicon germanium material in the source/drain regions of the device. This method is ultimately limited by both the electron/hole mobility and yield stress (i.e. energy to form a dislocation) of the substrate material (e.g. silicon).

Channel mobility may be improved by replacing silicon with a higher electron mobility material. One such material is graphene. Graphene is a one-atom thick planar sheet of $sp^2$-bonded carbon atoms that form a honeycomb-like crystal lattice structure, and has a carrier mobility considerably high than silicon (i.e. silicon mobility is about 70 $cm^2/Vsec$ and graphene on silicon carbide mobility is about 5,000-10,000 $cm^2/Vsec$).

Graphene channel transistors may be formed from a silicon carbide substrate through annealing the silicon carbide substrate at temperatures at or near the melting point of silicon. At these temperatures, silicon incongruently evaporates from the silicon carbide substrate leaving behind excess carbon which forms an epitaxial graphene layer on the silicon carbide substrate surface. However, silicon carbide substrates are expensive relative to silicon substrates and are generally only formed in small diameters. In another method, graphene transistors are fabricated by exfoliating a graphene layer from high quality graphite and using mechanical techniques to place the graphene layer on a silicon substrate. However, this process is expensive and complex. In still another method, transistors may be fabricated by growing graphene layers at modestly low temperatures on catalytic metal substrates, such as copper, iridium, and cobalt, through chemical vapor deposition or plasma enhanced chemical vapor deposition, separating the graphene film from the metal substrate and then mechanically transferring the graphene film onto a silicon substrate. However, this process is also expensive and complex.

FIGS. 1-17 illustrate various methods of fabricating a graphene layer for the formation of a microelectronic transistor. As shown in FIG. 1, a structural substrate, such as a silicon substrate 102 having a first surface 104, may be provided. In a specific embodiment of the present description, the silicon substrate 102 may have a (111) orientation, which may be required to form a (0001) plane of graphene epitaxially on a resulting silicon carbide layer, as will be discussed.

A silicon carbide layer may be formed on the silicon substrate 102, as will be discussed in various embodiments. The silicon carbide layer may be 3C—SiC (or Beta-SiC), which is known as the zinc-blende crystal structure (also known as "cubic poly type") of silicon carbide. The silicon carbide layer is essentially a formation structure or substrate that facilitates the subsequent formation of a graphene layer. The term "formation substrate" may refer to any substrate that facilitates the formation of graphene.

Figure 2:
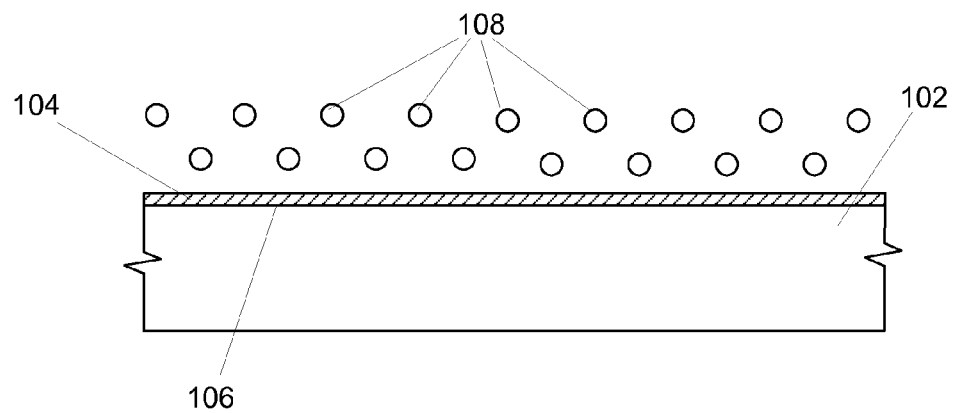
FIG. 2 illustrates a side cross-sectional view of a silicon carbide buffer layer formed by chemical of a carbon-containing gas and the substrate of FIG. 1.
Figure 3:
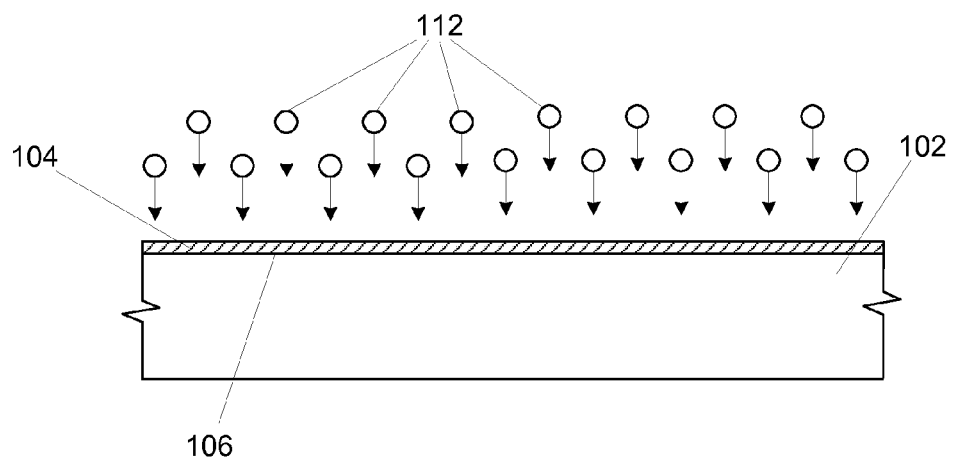
FIG. 3 illustrates a side cross-sectional view of a silicon carbide buffer layer formed by implantation of carbon into the silicon substrate of FIG. 1.

In one embodiment, as shown in FIG. 2, a silicon carbide buffer layer 106 may be formed on the substrate first surface 104 through direct chemical reaction between the silicon substrate 102 and a carbon-containing gas 108, such as methane, ethylene, butane, and the like. In another embodiment, the silicon carbide buffer layer 106 may be formed by carbon 112 being implanted in the silicon substrate 102, as shown in FIG. 3.

Figure 4:
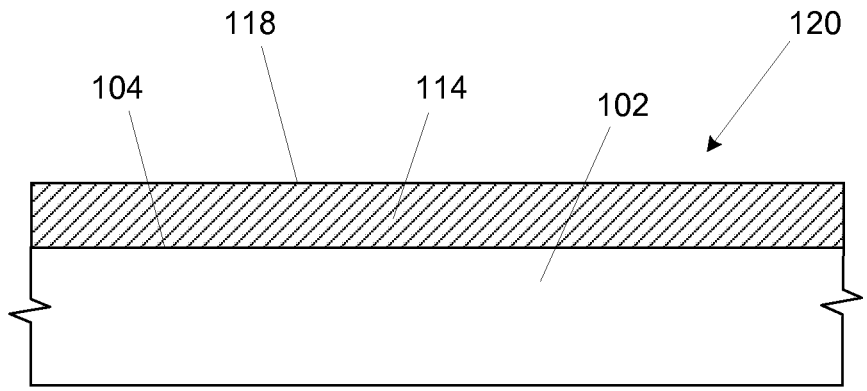
FIG. 4 illustrates a side cross-sectional view of a silicon carbide layer formed on the silicon carbide buffer layer, thereby forming a silicon carbide/silicon layered structure.

After the silicon carbide buffer layer 106 has been formed, the silicon carbide layer 114 may be epitaxially formed on the silicon carbide buffer layer 106 to form a silicon carbide/silicon layered structure 120, as shown in FIG. 4. As shown, the silicon carbide buffer layer 106 may be subsumed into the silicon carbide layer 114. The silicon carbide layer 114 may be formed by chemical vapor deposition using a silicon and carbon containing gas or gases, including, but not limited to, silane, disilane, acetylene, ethylene, propane, methylchloride, tetramethylsilane, hexamethyldisilane, methyltrichlorosilane, methylbromosilane. In a specific embodiment, the silicon carbide layer 114 is epitaxially formed at a temperatures from about 750° C. to 1100° C. using methylsilane ($Si(CH_3)H_3$).

Additionally, the silicon carbide layer 114 may be exitaxially formed by other techniques, including, but not limited to, sputter deposition, molecular beam epitaxy, and atomic layer epitaxy.

As will be understood to those skilled in the art, additional process refinements may be employed during the formation of the silicon carbide buffer layer 106 and the silicon carbide layer 114 to control the strain and crystalline defects formed in the silicon carbide layer 114. These refinements may include, but are not limited to, utilizing off-axis silicon substrates or intentionally introducing "undulating" surface topography onto the silicon substrate surface, which effectively allows certain crystallographic defects (such as dislocations and stacking faults) to be eliminated ("grown out") during the process of epitaxial deposition.

Figure 5:
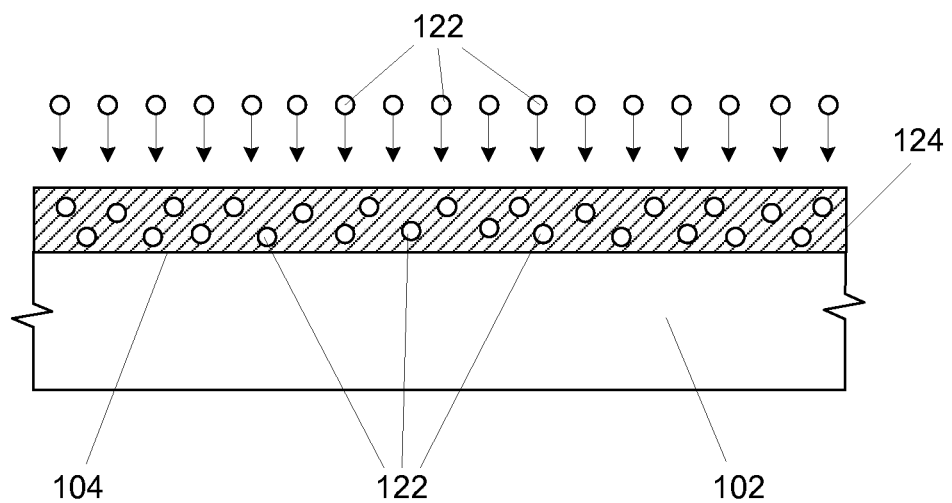
FIG. 5 illustrates a side cross-sectional view of doping impurities into the silicon carbide layer of FIG. 4.

In a complementary embodiment shown in FIG. 5, the silicon carbide layer 114 (see FIG. 4) may be doped with deep-level impurities 122 such as iron or vanadium to form a semi-insulating silicon carbide layer 124. In this complementary embodiment, the silicon carbide layer 114 (see FIG. 4) may be doped through ion implantation using vanadium, or during silicon carbide chemical vapor deposition using t-butylferrocen ($C_{14}H_{17}Fe$). It is understood that other combinations of metals and metal organics that result in deep-level, compensating impurities may be used as well. The formation of semi-insulating silicon carbide layer 124 may allow for more effective device isolation and faster operation of a subsequently formed graphene transistor.

Figure 6:
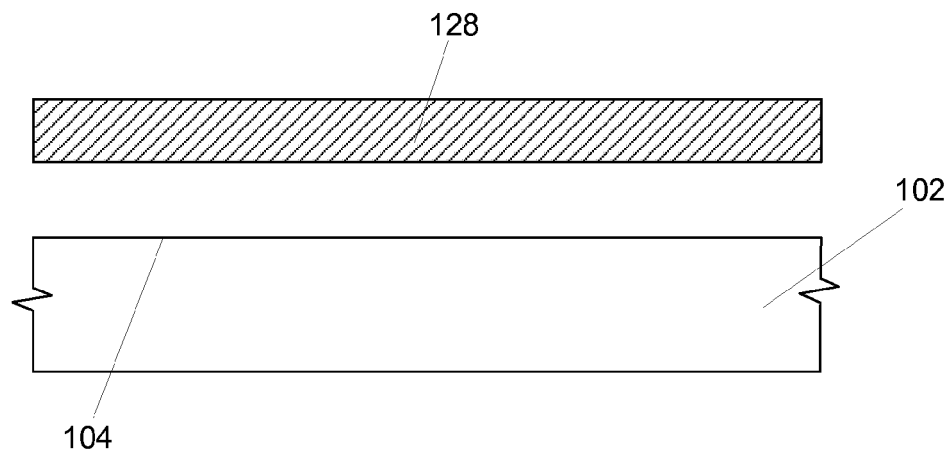
FIG. 6 illustrates a side cross-sectional view of a thin silicon carbide wafer to be attached to the silicon substrate to form the silicon carbide/silicon layered structure of FIG. 4.

In still another embodiment as shown in FIG. 6, a thin silicon carbide wafer 128 may be bonded to a silicon substrate 102 to become the silicon carbide layer 114 and form the silicon carbide/silicon layered structure 120, as shown in FIG. 4.

After the silicon carbide layer 114 has been formed on the silicon substrate 102, an outer surface 118 (see FIG. 4) of the silicon carbide layer 114 may be polished to remove any surface topography (e.g. facets, growth steps, surface roughness, and the like) that may have formed. After the polish process, the silicon carbide/silicon layered substrate 120 may be cleaned to removed polish process chemicals and to remove any surface oxides that may have formed on the silicon carbide layer outer surface 118.

In one embodiment of the present description, the silicon carbide layer outer surface 118 may be polished with a chemical mechanical polishing/planarization ("CMP") process using a colloidal silicon dioxide slurry. The silicon carbide/silicon layered substrate 120 may undergo various wet chemical cleans known in the industry to remove any residual CMP slurry. A final wet chemical treatment may include immersion in dilute hydrofluoric acid to remove surface oxides.

In one embodiment, a final treatment of the silicon carbide layer outer surface 118 may consist of annealing and surface etching in flowing hydrogen gas at a temperature of about 1000-1200° C. to further eliminate surface oxides and to produce a structurally well ordered, hydrogen terminated surface.

It is understood that various combinations of surface polishing/planarization, cleaning, and etching may be employed. It is also understood that any or all surface preparation steps that have been described may not necessarily be utilized.

Figure 7:
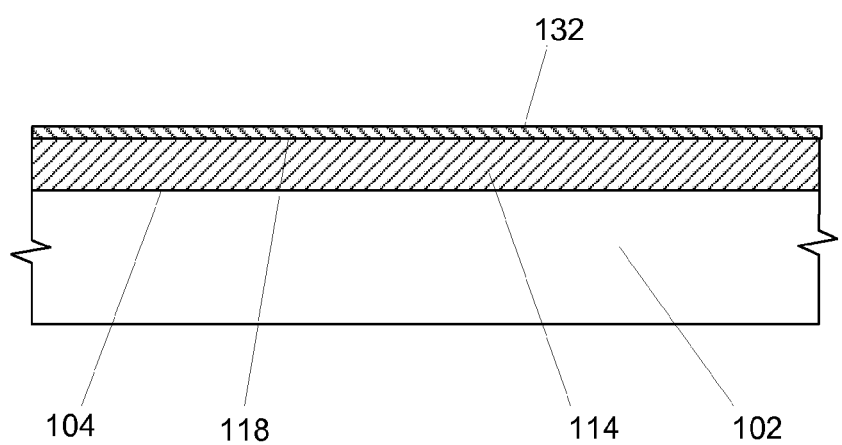
FIG. 7 illustrates a side cross-section view of a graphene layer formed on the silicon carbide layer for FIG. 4.

After the formation of the silicon carbide/silicon layered substrates 120 and optional preparation of the silicon carbide layer outer surface 118, a graphene layer 132 can be epitaxially formed on the silicon carbide layer outer surface 118, as shown in FIG. 7. The graphene layer 132 may be formed by either volatizing/sublimating silicon from the silicon carbide layer outer surface 118 or by reaction of the silicon carbide layer outer surface 118 with carbon-containing gas. In the one embodiment, the graphene layer 132 may be formed immediately after the hydrogen anneal, discussed above, by shutting off the hydrogen gas and annealing the silicon carbide/silicon layered substrate 120 in a vacuum at a temperature of about 1250-1400° C. to desorb surface hydrogen and sublimate silicon. In another embodiment, the silicon carbide layer outer surface 118 may receive only a wet chemical hydrofluoric acid clean, as discussed above, and the silicon carbide/silicon layered substrate 120 may be annealed at temperatures greater than about 1300° C. to desorb $SiO_x$ and produce the epitaxial graphene layer 132.

In another embodiment, the silicon carbide/silicon layered substrate 120, as shown in FIG. 4, may be annealed in dilute flowing silane gas, including, but not limited to $SiH_4$, $Si_2H_6$, $Si_3H_8$, and the like, to reduce and desorb surface oxides at temperatures of about 1000° C. The graphene layer 132, as shown in FIG. 7, may then be formed on the oxide free silicon carbide layer outer surface 118 by chemical vapor deposition at a temperature of about 950° C. using $C_2H_4$ or other hydrocarbon gases. In one embodiment, the graphene layer 132 is formed at temperatures lower than the melting point of silicon.

In still another embodiment of the present description, the silicon carbide/silicon layered substrate 120, as shown in FIG. 4, may be annealed in gallium gas, germanium gas, germane, or digermane to reduce and desorb surface oxides at relatively low temperatures of about 700-900° C., followed by the formation of the graphene layer 132, as shown in FIG. 7, at slightly higher temperatures (i.e. about 950° C.) through either silicon volatilization and/or hydrocarbon chemical vapor deposition, as will be understood to those skilled in the art.

Figure 8:
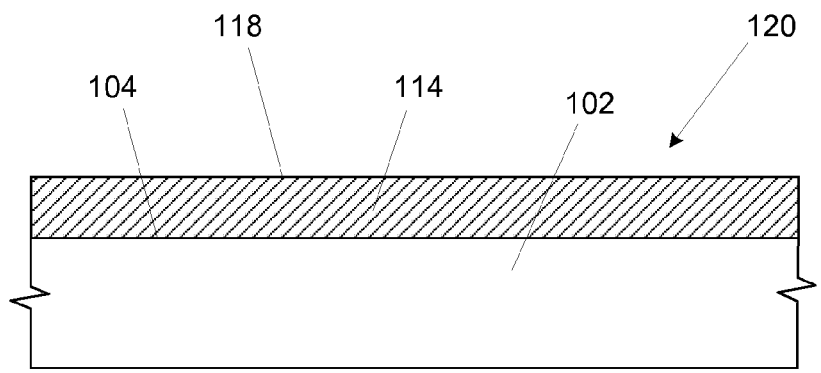
FIG. 8 illustrates a side cross-sectional view of a silicon carbide layer formed on the silicon carbide buffer layer, thereby forming a silicon carbide/silicon layered structure.
Figure 9:
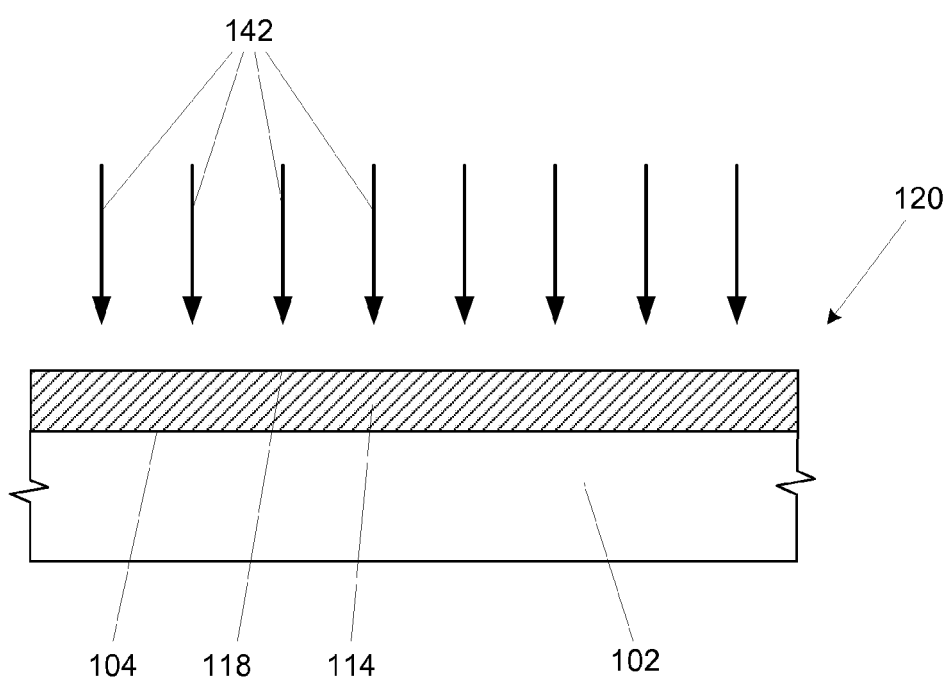
FIG. 9 illustrates a side cross-sectional view of annealing the structure of FIG. 8 to reduce and desorb surface oxides.
Figure 10:
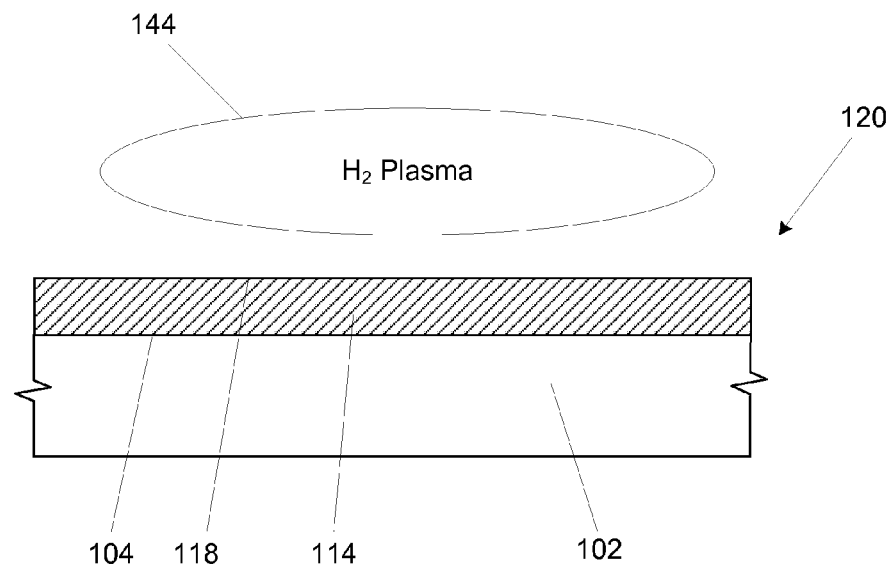
FIG. 10 illustrates a side cross-sectional view of plasma treating the structure of FIG. 9 to produce a hydrogen terminated carbon rich surface.
Figure 11:
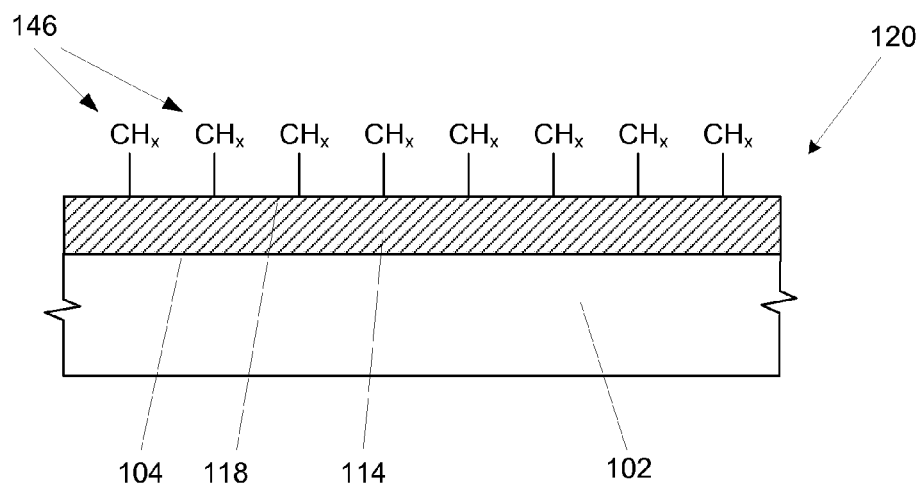
FIG. 11 illustrates a side cross-sectional view of the hydrogen terminated carbon rich surface of FIG. 10.
Figure 12:
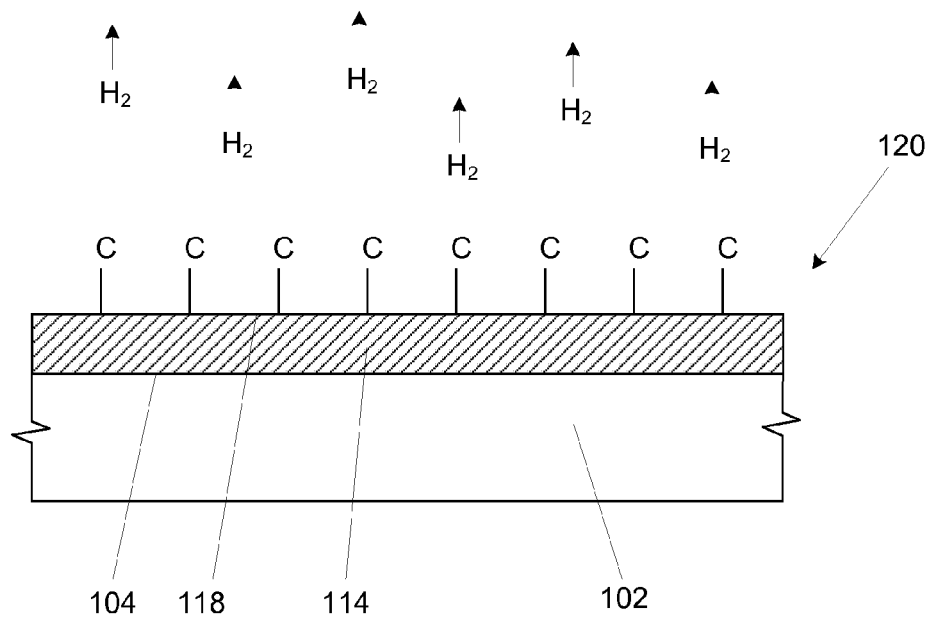
FIG. 12 illustrates a side cross-sectional view of annealing the structure of FIG. 11 to desorb hydrogen therefrom.
Figure 13:
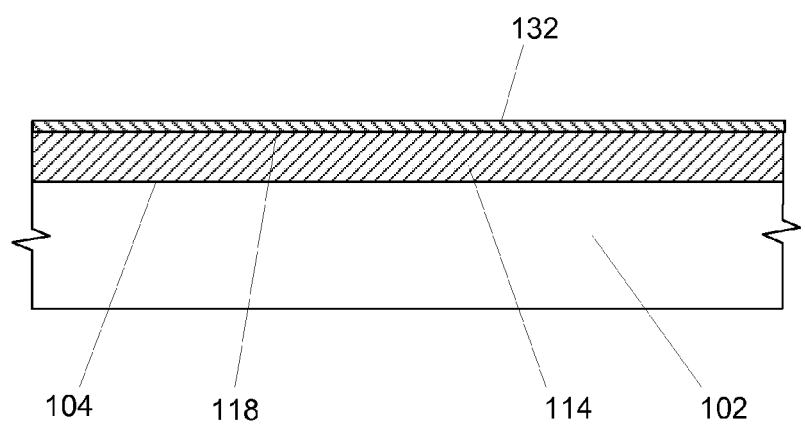
FIG. 13 illustrates a side cross-sectional view of a graphene layer formed on the structure of FIG. 12.

In one specific embodiment, as shown in FIG. 8, the first surface 104 of the silicon substrate 102 may be converted to the silicon carbide layer 114 either through direct reaction of silicon with various hydrocarbon gases and/or epitaxial deposition of silicon carbide on the silicon substrate by chemical vapor deposition, molecular beam epitaxy or other related techniques, as previously discussed. As shown in FIG. 9, the silicon carbide layer outer surface 118 may be annealed, (shown as lines 142) in gallium gas, germanium gas, germane, or digermane to reduce and desorb surface oxides at relatively low temperatures of about 700-900° C. The anneal may be followed by a low temperature hydrogen gas plasma 144 (about 100-400° C.) to selectively remove surface silicon from the silicon carbide layer outer surface 118, as shown in FIG. 10, and produce a hydrogen terminated carbon rich surface (C—H$_x$) 146 on the silicon carbide layer outer surface 118, as shown in FIG. 11. As shown in FIG. 12, an anneal may be performed at temperatures of about 850° C. or lower to desorb the hydrogen from the silicon carbide layer outer surface 118 as hydrogen gas H$_2$ and leaving behind excess carbon C. The graphene layer 132 then forms from the excess carbon C (see FIG. 12) present on the silicon carbide layer outer surface 118, as shown in FIG. 13. This embodiment may allow for the formation of the graphene layer 132 at temperatures of about 200-400° C. lower than methods previously described.

Figure 14:
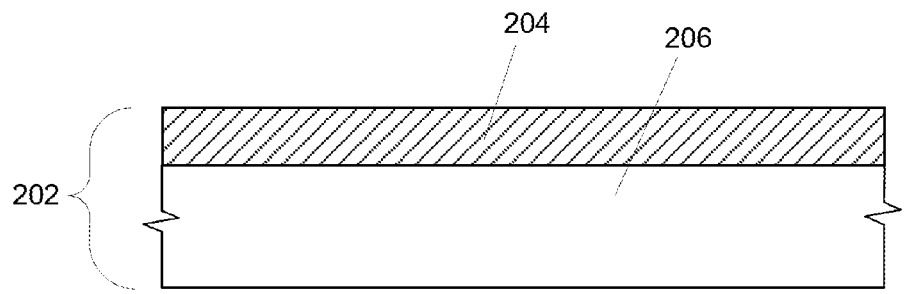
FIGS. 14-17 illustrates a method of forming a graphene layer by decomposition of thermodynamically unstable carbide.

In another embodiment shown in FIGS. 14-17, a thermodynamically unstable carbide (hereinafter "XC") may be used to form the graphene layer. As shown in FIG. 14, a substrate 202 may be provided. The substrate 202 may be a semiconductor such as silicon, germanium, diamond, gallium arsenide, indium phosphide, and the like. In another embodiment, the substrate may be an insulator, such as silicon dioxide, aluminum oxide, or silicon-on-insulator. In an illustrated embodiment, the substrate 202 may be a bilayer substrate with a formation substrate 204, such as (111) silicon carbide, (0001) hexagonal boron nitride ("h-BN") or any other substrate that has a lattice structure substantially analogous to the (0001) basal plane of graphite, as will be understood to those skilled in the art, abutting a structural substrate 206, such as a silicon substrate.

Figure 15:
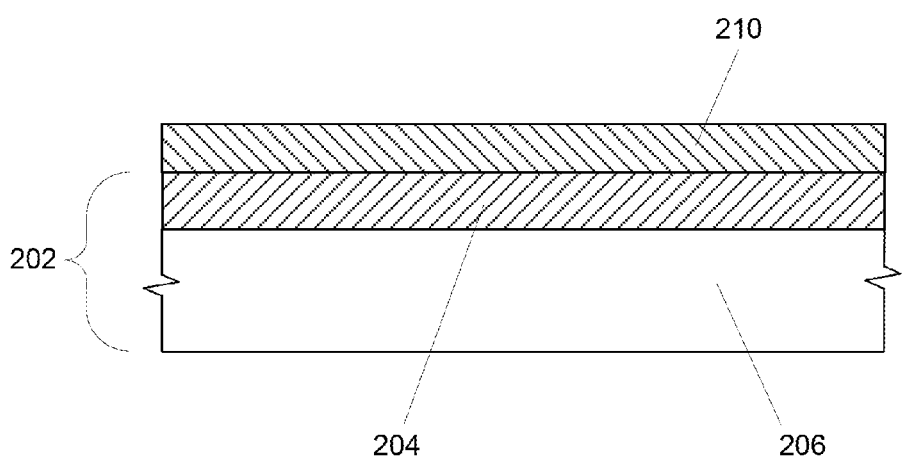

As shown in FIG. 15, a thermodynamically unstable XC carbide layer 210 may be deposited on the formation substrate 204. In one embodiment, the XC carbide layer 210 may be unstable at temperatures of about 400-600° C. In other words, in the temperature range of about 400-600° C., the XC carbide layer 210 decomposes into X and C (carbon). The X component may also have a high vapor pressure at a temperature of about 400-600° C. and easily sublimates and desorbs. In a specific embodiment, the XC carbide layer 210 may include, but is not limited to germanium carbide (e.g. GeC$_x$) and tin carbide (e.g. SnC$_x$). In another embodiment, the XC carbide layer 210 is non-stoichiometric and may contain as little as 5-10% carbon, such as Ge$_{0.95}$C$_{0.05}$.

In one embodiment, the XC carbide layer 210 may be epitaxially deposited on the formation substrate 204 by low-pressure chemical vapor deposition, molecular beam epitaxy, atomic layer epitaxy, or the like. In another embodiment, the XC carbide layer 210 may be deposited as an amorphous film on the substrate by plasma enhanced chemical vapor deposition, ion beam deposition, reactive sputtering, spin-on deposition, or the like.

It is understood that prior to deposition of the XC carbide layer 210, various surface treatments, known in the art, may be performed to remove surface oxides. It is further understood that prior to deposition of the XC carbide layer 210, various buffer, nucleation, epi, or seed layers may be deposited on the formation substrate 204 to facilitate subsequent epitaxial formation of graphene, as will be discussed.

Figure 16:
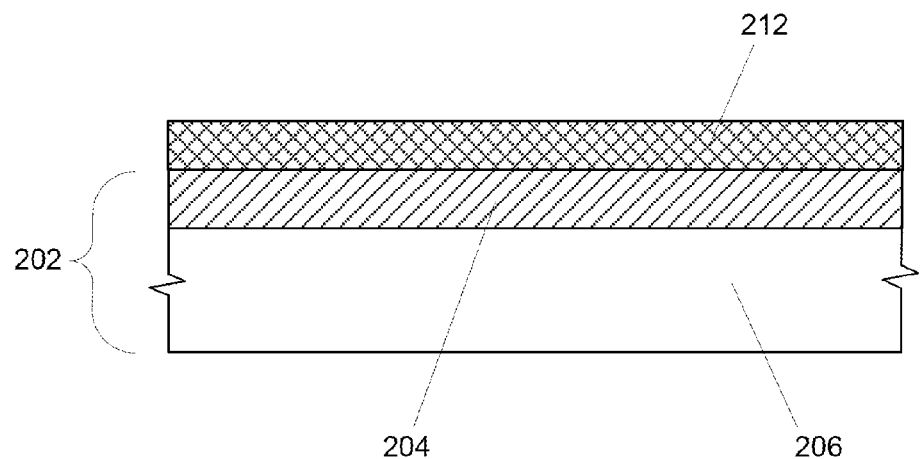
Figure 17:
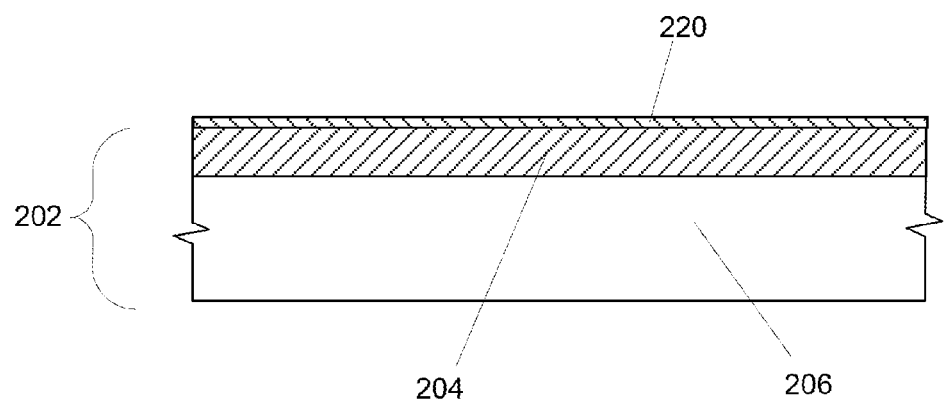

In one embodiment, the XC carbide layer 210 may be decomposed into X and C to form a decomposed XC carbide layer 212, as shown in FIG. 16. The X component in the decomposed XC carbide layer 212 may be vaporized/sublimated to leave behind a graphene layer 220, as shown in FIG. 17. In another embodiment, the X component may be discongruently volatized from the XC carbide layer 210 to leave behind only carbon (C) which forms the graphene layer 220, as shown in FIG. 17.

In a specific embodiment, amorphous germanium carbide (e.g. GeC$_x$) may be deposited as the XC carbide layer 210 by plasma enhanced chemical vapor deposition on a formation substrate 204, comprising (0001)6H—SiC substrate, and heated under vacuum to a temperature of about 400° C., wherein the germanium carbide decomposes into the decomposed XC carbide layer 212 of germanium and carbon, as shown in FIG. 16. The decomposed XC carbide layer 212 may be further heated to a temperature of about 1080° C. to sublimate the germanium leaving behind the graphene layer 220, as shown in FIG. 17.

In another embodiment, amorphous tin carbide (e.g. SnC$_x$) may be deposited as the XC carbide layer 210 by plasma enhanced chemical vapor deposition on the formation substrate 204, comprising (0001) hexagonal boron nitride, and heated under vacuum to a temperature of about 400° C., wherein the tin carbide decomposes into the decomposed XC carbide layer 212 of tin and carbon, as shown in FIG. 16. The decomposed XC carbide layer 212 may be further heated to still higher temperatures of about 980° C. to sublimate the tin leaving behind the graphene layer 220, as shown in FIG. 17.

In still another example, an epitaxial Ge$_{0.95}$C$_{0.05}$ may be epitaxially deposited as the XC carbide layer 210 on the formation substrate 204 comprising (111) silicon carbide, and heated under vacuum to a temperature of about 400° C., wherein the epitaxial Ge$_{0.95}$C$_{0.05}$ decomposes into a decomposed XC carbide layer 212 of germanium and carbon, as shown in FIG. 16. The decomposed XC carbide layer 212 may be further heated to a temperature of about 1080° C. to sublimate germanium leaving behind the graphene layer 220, as shown in FIG. 17.

In yet another example, magnesium carbide (MgC$_2$) may be sputter deposited as the XC carbide layer 210 on the formation substrate 204, comprising (111) silicon carbide, and heated to a temperature of about 400° C. where the magnesium carbide decomposes into magnesium and carbon, as shown in FIG. 16. The decomposed XC carbide layer 212 may be further heated to a temperature of about 600° C. where magnesium sublimates leaving behind carbon, which can be flash annealed at a temperature of about 850° C. to crystallize the graphene layer 220, as shown in FIG. 17.

Figure 18:
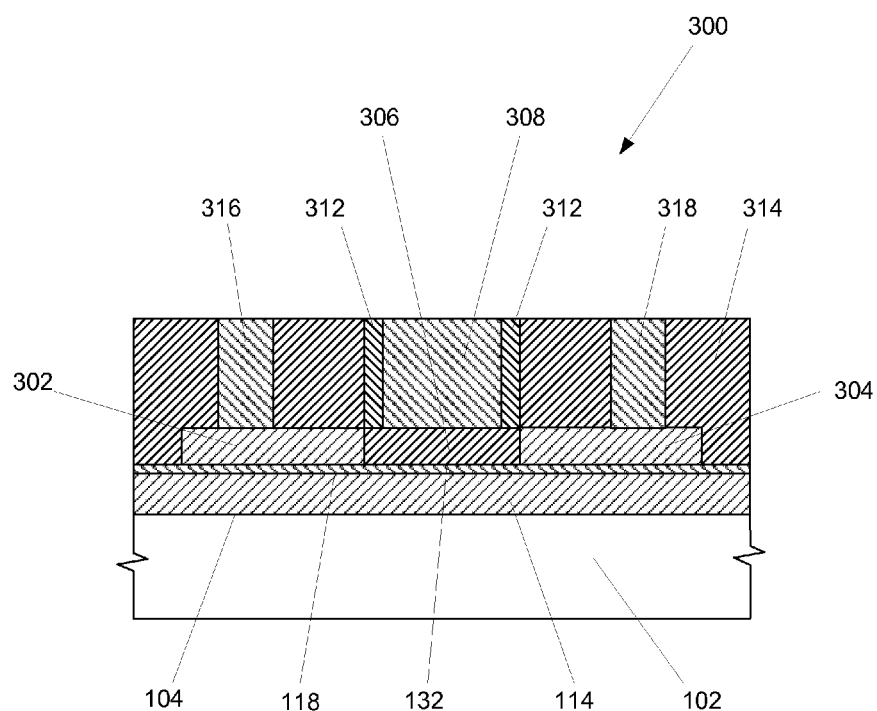
FIG. 18 illustrates a transistor formed on a graphene layer.

As shown in FIG. 18, a field effect transistor 300 maybe be formed on the graphene layer, which may be formed by any processes previously discussed. Numerous methods exist for forming a field effect transistor 300 on graphene exist and consist of various permutations and combinations of techniques known in the industry and consisting of gate dielectric deposition, source/drain formation, photolithography, plasma etching, gate and source drain contact formation and metallization via sputter deposition. As the steps and techniques of fabricating field effect transistors 300 are well known in the art, this description will forgo describing all such permutations and combinations, and will merely provide two brief examples.

For exemplary purposes, the field effect transistor 300 is shown formed on the graphene layer 132 of FIG. 7, which is formed on the silicon carbide layer 114 that is formed on the silicon substrate 102. One of the advantages of forming a graphene layer 132 on the silicon carbide layer 144 is that the silicon carbide layer 144 may induce a band gap in the graphene layer 132 for an improved functioning of field effect transistor 300, as will be understood to those skilled in the art.

The field effect transistor 300 may comprise a source region 302 and a drain region 304 separated by a gate dielectric 306. A gate 308 is formed on the gate dielectric 306, wherein sidewall spacers 312 abut the gate 308. An interlayer dielectric layer 314 may be formed over the source region 302 and the drain region 304 and adjacent the sidewall spacers 312. A source contact 316 may be formed through the interlayer dielectric layer 314 to contact the source region 302 and a drain contact 318 may be formed through the interlayer dielectric layer 314 to contact the drain region 304.

In one embodiment, an active region of the field effect transistor 300 may be patterned using a low-energy oxygen gas plasma etch. This may be followed by photolithography to define source/drain regions and blanket deposition of a titanium/platinum bilayer, palladium, or silver (2-20 nm). The metal deposition may be performed by evaporation, sputtering, atomic layer deposition or other methods. The source region 302 and the drain region 304 may be formed through the lift off of the photoresist. A gate dielectric 306 may be deposited by any known method, including but not limited to chemical vapor deposition, atomic layer deposition, and plasma enhanced chemical vapor deposition. The gate dielectric 306 may include, but is not limited to, silicon dioxide, aluminum oxide, or hafnium oxide. A gate metal, such as aluminum, titanium, silver, and the like, maybe deposited over the gate dielectric 306 and patterning, such as with photolithography, to form the gate 308.

In another embodiment, a more classic complementary metal-oxide-semiconductor based process flow may be utilized to form the field effect transistor 300 on the graphene layer 132, wherein the graphene layer becomes a channel layer. In this embodiment, the active region of the field effect transistor 300 may again be defined using photolithography and a low-energy oxygen gas plasma etch. The gate dielectric material may be deposited followed by a poly-silicon deposition. A hardmask material to facilitate gate patterning may or may not also be deposited. Standard photolithography and plasma etching processes are utilized to form the gate dielectric 306 from the gate dielectric material and the gate 308 from the poly-silicon.

Post plasma etching and hydrogen ash chemistries are utilized to remove remaining photoresist and clean the substrate (oxygen gas plasmas must be avoided in order to prevent loss of exposed graphene layer 132). Silicon nitride is then next blanket deposited over the wafer and aniostropically etched to form side wall spacers 312 on the poly-silicon gate 308. Titanium may then be deposited and patterned using photolithography and wet or plasma etching to define the source region 302 and the drain region 304 (an anneal to form titanium silicide over the gate electrode may be performed before or after the titanium patterning).

An interlayer dielectric layer 314, including but not limited to silicon dioxide, fluorine-doped silicon dioxide, and carbon-doped silicon oxide, may be deposited over the entire structure such as by plasma enhanced chemical vapor deposition, high density plasma, or chemical vapor deposition. Photolithography and plasma etching may be utilized to pattern an opening through the interlayer dielectric layer 314 to the source region 302 and an opening through the interlayer dielectric layer 314 to the drain region 304. These openings may be filled with a conductive material, such as tungsten or copper, such as by chemical vapor deposition, electroplating, or sputtering, to form the source contact 316 and the drain contact 318, respectively. It is understood that additional metal interconnections (not shown) may be formed using techniques well known in the industry to connect the field effect transistor 300 to other circuit component (not shown).

It is understood that shallow or deep trench isolation structures (not shown) may be formed by etching a trench into the silicon carbide layer 114 and filling the trench with a dielectric, such as silicon dioxide, before the formation of the graphene layer 132. Alternatively, the shallow or deep trench isolation structures (not shown) may also be formed after the formation of the graphene layer 132. In this latter case, the graphene layer 132 should be protected with an oxide layer, such as formed with a low temperature plasma enhance chemical vapor deposition, which can be removed later.

Figure 19:
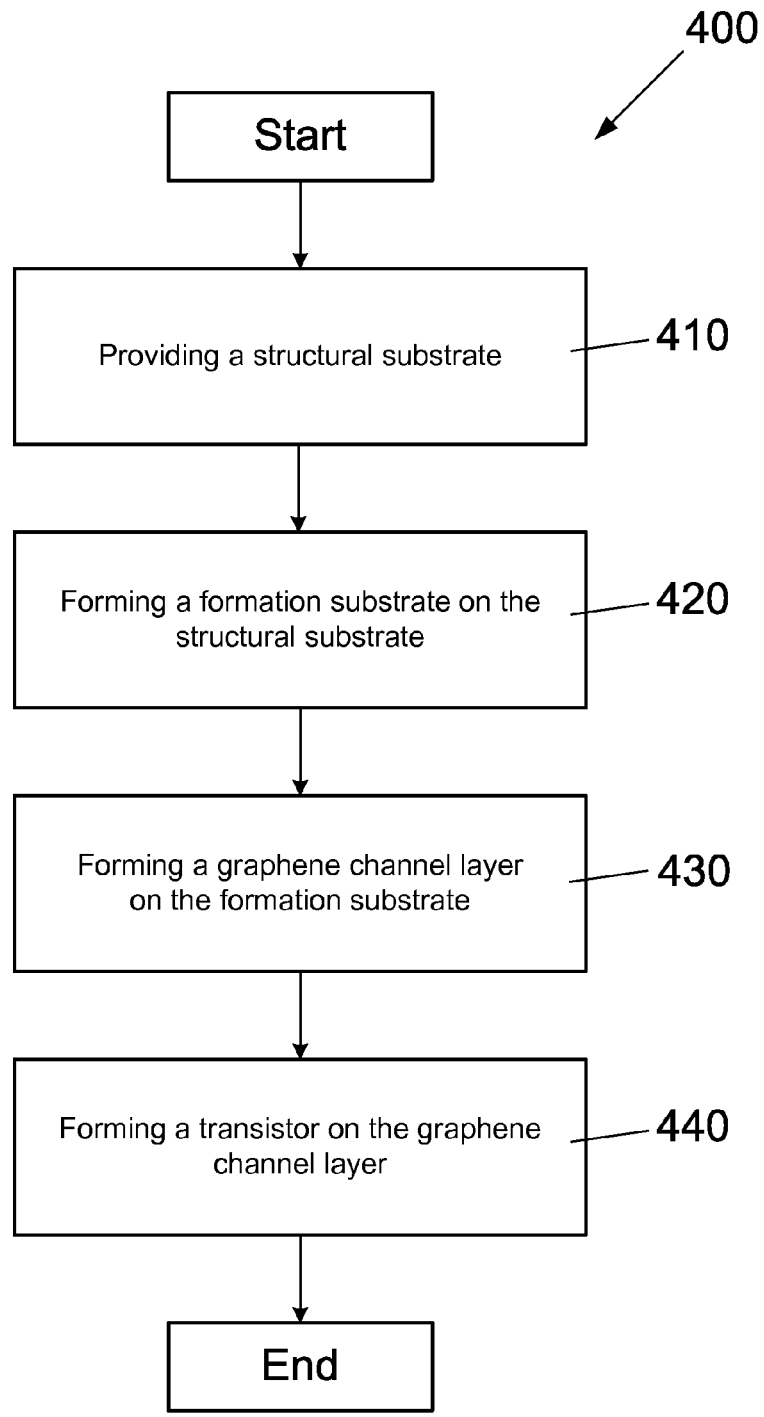
FIG. 19 is a flow diagram of a method of forming a graphene layer.

An embodiment of a process of forming a graphene layer of the present description is illustrated in the flow diagram 400 of FIG. 19. As defined in block 410, a structural substrate, such as silicon, may be provided. A formation substrate, such as silicon carbide, may be formed on the structural substrate, as shown in block 420. A graphene channel layer may be formed on the formation substrate, as shown in block 430. A transistor may be formed on the graphene channel layer, as shown in block 440.

It is also understood that the subject matter of the present description is not necessarily limited to specific applications illustrated in FIGS. 1-19. The subject matter may be applied to other stacked device applications. Furthermore, the subject matter may also be used in any appropriate application outside of the microelectronic device fabrication field. Furthermore, the subject matter of the present description may be a part of a larger bumpless build-up package, it may include multiple stacked microelectronic dice, it may be formed at a wafer level, or any number of appropriate variations, as will be understood to those skilled in the art.

The detailed description has described various embodiments of the devices and/or processes through the use of illustrations, block diagrams, flowcharts, and/or examples. Insofar as such illustrations, block diagrams, flowcharts, and/ or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of fabricating a transistor comprising:
   providing a structural substrate comprising silicon;
   forming a formation substrate on the structural substrate, wherein the formation substrate comprises a silicon carbide layer;
   forming a graphene layer on the formation substrate comprising annealing the silicon carbide layer in a gas selected from the group comprising gallium gas, germanium gas, germane, and digermane to reduce and desorb surface oxides at temperatures of about 700-900° C. and forming the graphene layer by silicon volatization at temperature of about 950° C.;
   forming a source region abutting the graphene layer;
   forming a drain region abutting the graphene layer;
   forming a gate dielectric abutting the graphene layer between the source region and the drain region, wherein the source region and the drain region abut the gate dielectric; and
   forming a gate abutting the gate dielectric.

2. The method of claim 1, wherein forming the silicon carbide layer comprises reacting a carbon-containing gas with the silicon substrate to form a silicon carbide buffer layer, and forming a silicon carbide layer on the silicon carbide buffer layer.

3. The method of claim 1, wherein forming the silicon carbide layer comprises implanting carbon into the silicon substrate to form a silicon carbide buffer layer, and forming a silicon carbide layer on the silicon carbide buffer layer.

4. The method of claim 1, wherein forming the silicon carbide layer comprises bonding a silicon carbide wafer to the structural substrate.

5. The method of claim 1, further including doping an impurity into the silicon carbide layer.

6. The method of claim 5, wherein the impurity comprises iron or vanadium.

7. A method of forming a transistor comprising:
   depositing a thermodynamically unstable XC carbide layer on a formation substrate comprising depositing amorphous germanium carbide on a (0001)6H-SiC substrate;
   decomposing the XC carbide layer into an X component and carbon;
   volatilizing the X component;
   forming a graphene layer from the carbon;
   forming a source region abutting the graphene layer;
   forming a drain region abutting the graphene layer;
   forming a gate dielectric abutting the graphene layer between the source region and the drain region, wherein the source region and the drain region abut the gate dielectric; and
   forming a gate abutting the gate dielectric.

8. The method of claim 7, wherein decomposing the XC carbide layer comprises heating under vacuum to a temperature of about 400° C., and wherein volatilizing the X component comprises sublimating germanium by heating to a temperature of about 980° C.

9. A method of forming a transistor comprising:
   depositing a thermodynamically unstable XC carbide layer on a formation substrate;
   decomposing the XC carbide layer into an X component and carbon;
   volatilizing the X component;
   forming a graphene layer from the carbon;
   forming a source region abutting the graphene layer;
   forming a drain region abutting the graphene layer;
   forming a gate dielectric abutting the graphene layer between the source region and the drain region, wherein the source region and the drain region abut the gate dielectric;
   forming a gate abutting the gate dielectric; and
   wherein depositing the XC carbide layer on a formation substrate comprises depositing amorphous tin carbide on a (0001) hexagonal boron nitride substrate.

10. The method of claim 9, wherein decomposing the XC carbide layer comprises heating under vacuum to a temperature of about 400° C., and wherein volatilizing the X component comprises sublimating tin by heating to a temperature of about 980° C.

11. A method of forming a transistor comprising:
    depositing a thermodynamically unstable XC carbide layer on a formation substrate;

decomposing the XC carbide layer into an X component and carbon;
volatilizing the X component;
forming a graphene layer from the carbon;
forming a source region abutting the graphene layer;
forming a drain region abutting the graphene layer;
forming a gate dielectric abutting the graphene layer between the source region and the drain region, wherein the source region and the drain region abut the gate dielectric;
forming a gate abutting the gate dielectric; and
wherein depositing the XC carbide layer on a formation substrate comprises depositing an epitaxial $Ge_{0.95}C_{0.05}$ layer on a (111) silicon carbide substrate.

12. The method of claim 11, wherein decomposing the XC carbide layer comprises heating under vacuum to a temperature of about 400° C., wherein volatilizing the X component comprises sublimating germanium heated at a temperature of about 1080° C.

13. A method of forming a transistor comprising:
depositing a thermodynamically unstable XC carbide layer on a formation substrate comprising depositing magnesium carbide on a (111) silicon carbide substrate;
decomposing the XC carbide layer into an X component and carbon;
volatilizing the X component;
forming a graphene layer from the carbon;
forming a source region abutting the graphene layer;
forming a drain region abutting the graphene layer;
forming a gate dielectric abutting the graphene layer between the source region and the drain region, wherein the source region and the drain region abut the gate dielectric;
forming a gate abutting the gate dielectric; and
wherein decomposing the XC carbide layer into an X component and carbon comprises heating the XC carbide layer to a temperature of about 400° C., wherein volatilizing the X component comprises heating to a temperature of about 600° C., and wherein forming the graphene layer comprises flash annealing at a temperature of about 850° C.

14. A method of fabricating a transistor comprising:
providing a structural substrate comprising silicon;
forming a formation substrate on the structural substrate, wherein the formation substrate comprises a silicon carbide layer;
forming a graphene layer on the formation substrate, wherein forming the graphene layer comprises annealing the silicon carbide layer in a gas selected from the group comprising gallium gas, germanium gas, germane, and digermane at temperatures of about 700-900° C. and forming the graphene layer by hydrocarbon chemical vapor deposition;
forming a source region abutting the graphene layer;
forming a drain region abutting the graphene layer;
forming a gate dielectric abutting the graphene layer between the source region and the drain region, wherein the source region and the drain region abut the gate dielectric; and
forming a gate abutting the gate dielectric.

15. The method of claim 14, wherein forming the silicon carbide layer comprises reacting a carbon-containing gas with the silicon substrate to form a silicon carbide buffer layer, and forming a silicon carbide layer on the silicon carbide buffer layer.

16. The method of claim 14, wherein forming the silicon carbide layer comprises implanting carbon into the silicon substrate to form a silicon carbide buffer layer, and forming a silicon carbide layer on the silicon carbide buffer layer.

17. The method of claim 14, wherein forming the silicon carbide layer comprises bonding a silicon carbide wafer to the structural substrate.

18. The method of claim 14, further including doping an impurity into the silicon carbide layer.

19. The method of claim 18, wherein the impurity comprises iron or vanadium.

20. A method of fabricating a transistor comprising:
providing a structural substrate comprising silicon;
forming a formation substrate on the structural substrate, wherein the formation substrate comprises a silicon carbide layer;
forming a graphene layer on the formation substrate, wherein forming the graphene layer comprises:
    annealing the silicon carbide layer in a gas selected from the group comprising gallium gas, germanium gas, germane, and digermane at temperatures of about 700-900° C.;
    treating with a hydrogen gas plasma at temperatures of about 100-400° C. to selectively remove surface silicon from a silicon carbide layer outer surface and produce a hydrogen terminated carbon rich surface; and
    annealing at temperatures of about 850° C. or lower to desorb the hydrogen from the silicon carbide layer outer surface and form the graphene layer remaining carbon;
forming a source region abutting the graphene layer;
forming a drain region abutting the graphene layer;
forming a gate dielectric abutting the graphene layer between the source region and the drain region, wherein the source region and the drain region abut the gate dielectric; and
forming a gate abutting the gate dielectric.

21. The method of claim 20, wherein forming the silicon carbide layer comprises reacting a carbon-containing gas with the silicon substrate to form a silicon carbide buffer layer, and forming a silicon carbide layer on the silicon carbide buffer layer.

22. The method of claim 20, wherein forming the silicon carbide layer comprises implanting carbon into the silicon substrate to form a silicon carbide buffer layer, and forming a silicon carbide layer on the silicon carbide buffer layer.

23. The method of claim 20, wherein forming the silicon carbide layer comprises bonding a silicon carbide wafer to the structural substrate.

24. The method of claim 20, further including doping an impurity into the silicon carbide layer.

25. The method of claim 24, wherein the impurity comprises iron or vanadium.

* * * * *